(12) United States Patent
Chang

(10) Patent No.: US 11,791,428 B2
(45) Date of Patent: Oct. 17, 2023

(54) SOLAR PANEL SYSTEMS

(71) Applicant: Jitsen Chang, Austin, TX (US)

(72) Inventor: Jitsen Chang, Austin, TX (US)

( * ) Notice: Subject to any disclaimer, the term of this patent is extended or adjusted under 35 U.S.C. 154(b) by 240 days.

(21) Appl. No.: 17/198,239

(22) Filed: Mar. 10, 2021

(65) Prior Publication Data

US 2021/0202766 A1 Jul. 1, 2021

Related U.S. Application Data

(63) Continuation of application No. 16/371,953, filed on Apr. 1, 2019, now Pat. No. 10,991,837, which is a continuation of application No. 15/344,560, filed on Nov. 6, 2016, now Pat. No. 10,283,659.

(51) Int. Cl.
| | | |
|---|---|---|
| *H01L 31/042* | (2014.01) | |
| *H01L 31/043* | (2014.01) | |
| *H02S 20/30* | (2014.01) | |
| *H01L 31/054* | (2014.01) | |
| *H02S 20/00* | (2014.01) | |
| *H02S 20/23* | (2014.01) | |
| *H02S 30/00* | (2014.01) | |
| *H02S 30/10* | (2014.01) | |

(52) U.S. Cl.
CPC .......... *H01L 31/042* (2013.01); *H01L 31/043* (2014.12); *H01L 31/0547* (2014.12); *H02S 20/00* (2013.01); *H02S 20/23* (2014.12); *H02S 20/30* (2014.12); *H02S 30/00* (2013.01); *H02S 30/10* (2014.12); *Y02E 10/50* (2013.01)

(58) Field of Classification Search
CPC ..... H02S 30/00; H02S 20/23; H01L 31/0547; H01L 31/042; H01L 31/043
See application file for complete search history.

(56) References Cited

U.S. PATENT DOCUMENTS

| | | | |
|---|---|---|---|
| 2009/0071527 A1* | 3/2009 | Axtell | H01L 31/0543 136/244 |
| 2009/0071531 A1* | 3/2009 | Dame | H01L 31/042 136/251 |
| 2016/0149537 A1* | 5/2016 | Ott | H02S 20/00 136/251 |

* cited by examiner

*Primary Examiner* — Bethany L Martin

(57) ABSTRACT

Embodiments of the disclosure are generally related to solar panel configurations. In some embodiments, the active surface area of the solar panel is increased compared to traditional flat solar cell arrays. The increase in active surface area may increase solar panel efficiency. For example, in some embodiments, a single light ray may have portions reflected onto a plurality of solar cell surfaces to provide further opportunities for light capture and conversion to electricity.

20 Claims, 2 Drawing Sheets

SOLAR PANEL SYSTEMS

CROSS REFERENCE TO RELATED APPLICATION

The present application is a continuation of U.S. patent application Ser. No. 16/371,953, filed Apr. 1, 2019, which is a continuation of U.S. Pat. No. 10,283,659, filed Nov. 16, 2016, the contents of which are incorporated by reference herein in their entirety for all purposes.

BACKGROUND

Solar power is the Holy Grail of clean energy. Harnessing the power of the sun dates back to ancient times when mirrors and lenses were used to start fires. The idea that the sun provides a continuous source of clean energy is widely accepted in theory. But the limited efficiency of photovoltaic cells has limited the application of solar energy in the real world.

Accordingly, systems and methods for improving the efficiency of solar power may be desired.

SUMMARY

Efforts to improve the efficiency of solar power focus around several techniques. These include improving the efficiency of the photovoltaic cells themselves. Some designs split and direct light wavelengths towards specific photovoltaic cells. Other systems may use lenses to focus the incoming light onto photovoltaic cells. Additionally, dynamic systems may use motors to turn and move the solar panels to ensure they are always facing the sun.

Embodiments of the present invention are generally directed to solar cell configurations and arrays thereof, each of which may be used in conjunction with any of the above techniques for improving solar power efficiency.

In some embodiments, a solar panel may be provided that includes: a solar cell pit comprising a first solar cell forming a first pit side of the solar cell pit, a second solar cell forming a second pit side of the solar cell pit, and a third solar cell forming a third pit side of the solar cell pit—each of the first solar cell, the second solar cell, and the third solar cell may be configured to convert solar energy to electricity. The first solar cell may comprise a first edge and a second edge that converge at a ninety degree angle to form a corner of the first pit side; the second solar cell may comprise a first edge and a second edge that converge at a ninety degree angle to form a corner of the second pit side; and the third solar cell may comprise a first edge and a second edge that converge at a ninety degree angle to form a corner of the third pit side. The corner of the first pit side, the corner of the second pit side, and the corner of the third pit side may be joined together such that the first edge of the first solar cell is adjacent to the second edge of the second solar cell, the first edge of the second solar cell is adjacent to the second edge of the third solar cell, the first edge of the third solar cell is adjacent to the second edge of the first solar cell, and such that the first solar cell, the second solar cell, and the third solar cell are orthogonal to one another. A light ray received by the solar cell pit that impinges on the first solar cell may be partially captured by the first solar cell to be converted to electricity and partially reflected by the first solar cell toward the second solar cell. Light reflected by the first solar cell toward the second solar cell may be partially captured by the second solar cell to be converted to electricity and partially reflected by the second solar cell toward the third solar cell and light reflected by the second solar cell toward the third solar cell may be at least partially captured by the third solar cell to be converted to electricity.

The solar panel described above may include a plurality of the solar cell pits arranged in an array. In some embodiments, the first solar cell, the second solar cell, and the third solar cell may have a rectangular configuration. In some embodiments, the first solar cell, the second solar cell, and the third solar cell may have a triangular configuration.

In still further embodiments, a system may be provided that includes three of the solar panels described above. In some embodiments, the three solar panels may each having a rectangular configuration and may be joined together such that each of the three solar panels arc at 90-110 degrees relative to one another. And in some embodiments, the solar panels may be orthogonal to one another.

In still further embodiments, another system may be provided that includes three of the solar panels described above. The three solar panels may each have a triangular configuration and may be joined together such that each of the three solar panels are at 90-110 degrees relative to one another. And in some embodiments, the solar panels may be orthogonal to one another.

In further embodiments, a solar panel may be provided that includes: a solar cell pit comprising a first solar cell forming a first triangular pit side of the solar cell pit, a second solar cell forming a second triangular pit side of the solar cell pit, and a third solar cell forming a third triangular pit side of the solar cell pit—each of the first solar cell, the second solar cell, and the third solar cell configured to convert solar energy to electricity. The first solar cell may comprise a first edge and a second edge that converge at a 90-110 degree angle to form a corner of the first pit side; the second solar cell may comprise a first edge and a second edge that converge at a 90-110 degree angle to form a corner of the second pit side; and the third solar cell may comprise a first edge and a second edge that converge at a 90-110 degree angle to form a corner of the third pit side.

The corner of the first triangular pit side, the corner of the second triangular pit side, and the corner of the third triangular pit side may be joined together such that the first edge of the first solar cell is adjacent to the second edge of the second solar cell, the first edge of the second solar cell is adjacent to the second edge of the third solar cell, and the first edge of the third solar cell is adjacent to the second edge of the first solar cell.

At least some light rays received by the solar cell pit that impinge on the first solar cell may be partially captured by the first solar cell to be converted to electricity and partially reflected by the first solar cell toward the second solar cell. At least some light reflected by the first solar cell toward the second solar cell may be partially captured by the second solar cell to be converted to electricity and partially reflected by the second solar cell toward the third solar cell. And light reflected by the second solar cell toward the third solar cell may be at least partially captured by the third solar cell to be converted to electricity.

In some embodiments, a plurality of the solar cell pits may be provided that are arranged in an array.

In some embodiments, a solar panel system may be provided that includes three solar panels described above, the three solar panels may be joined together such that each of the three solar panels are at 90-110 degrees relative to one another. Optionally, the three solar panels may be orthogonal to one another.

In still further embodiments, a solar panel may be provided that includes a tessellated array of solar cell pits. Each of the solar cell pits of the array may include a first solar cell forming a first pit side of the solar cell pit, a second solar cell forming a second pit side of the solar cell pit, and a third solar cell forming a third pit side of the solar cell pit. Each of the first solar cell, the second solar cell, and the third solar cell may be configured to convert solar energy to electricity and each may comprise a first edge and a second edge that converge at a ninety degree angle to form a corner. The corners of the pit sides of the solar cell pit may be joined together such that the corners of the pit sides form a bottom of the solar cell pit and such that the pit sides are at an angle between 60-110 degrees with adjacent pit sides. The first solar cell, the second solar cell, and the third solar cell may comprise a triangular configuration or a rectangular configuration.

At least some light rays received by the solar cell pit that impinges on the first solar cell may be partially captured by the first solar cell to be converted to electricity and partially reflected by the first solar cell toward the second solar cell. At least some light reflected by the first solar cell toward the second solar cell may be partially captured by the second solar cell to be converted to electricity and partially reflected by the second solar cell toward the third solar cell. Light reflected by the second solar cell toward the third solar cell may be at least partially captured by the third solar cell to be converted to electricity.

In some embodiments, the pit sides are at an angle between 90-110 degrees with adjacent pit sides. Optionally, the pit sides are orthogonal with adjacent pit sides.

In some embodiments, a solar panel system may be provided that includes three solar panels described above, the three solar panels may be joined together such that each of the three solar panels are at 60-110 degrees with adjacent solar panels. Optionally, the three solar panels are at 90-110 degrees with adjacent solar panels. In some embodiments, the three solar panels arc orthogonal to one another.

In some embodiments, the three solar panels may have a rectangular configuration. In other embodiments, the three solar panels may have a triangular configuration.

DETAILED DESCRIPTION

The basis of the design proposed in this patent is arranging the solar panels and photovoltaic cells in a layout that better captures the initial incoming light and the subsequently reflected light. The proposed layout may add depth to the traditional panels that have all the photovoltaic cells laid flat next to one another forming large flat panels. For example, in some embodiments, instead of arranging the photovoltaic cells in a flat planar array, embodiments of the present disclosure may include a layout where cells are arranged to form solar cell pits with openings, thereby increasing the solar cell surface area of the solar panel. Optionally, a plurality of these pits may be tessellated next to one another to the size and shape of the desired panel. In some embodiments, each of the plurality pits may have a retroreflector configuration.

In some embodiments, solar cell pits may be made up of three pit sides that are orthogonal to one another. Optionally, each pit side may be planar. Each pit side may have two edges that form a corner of the pit side. In some embodiments, the edges may meet at a ninety degree angle to form the corner. Each of the ninety degree corners of the three pit sides may be joined such that each pit side is orthogonal to one another to form the bottom of the solar cell pit. In some embodiments, the three pit sides may form a pit with a corner cube configuration.

This arrangement of pit sides may increase the light energy captured from light entering each of the solar cell pits. While some light energy is captured at initial contact with one of the pit sides, a portion of the light energy may be reflected from the pit side initially contacted. When the light ray is non-normal to the pit side, this reflected light may be directed to an adjacent pit side where additional light energy may be captured. Any portion of light reflected from the adjacent pit side will impinge on the final pit side where another opportunity arises to capture light. Accordingly, the configuration may increase light capture of light energy that is reflected from one or more of the pit sides.

Figure 1:
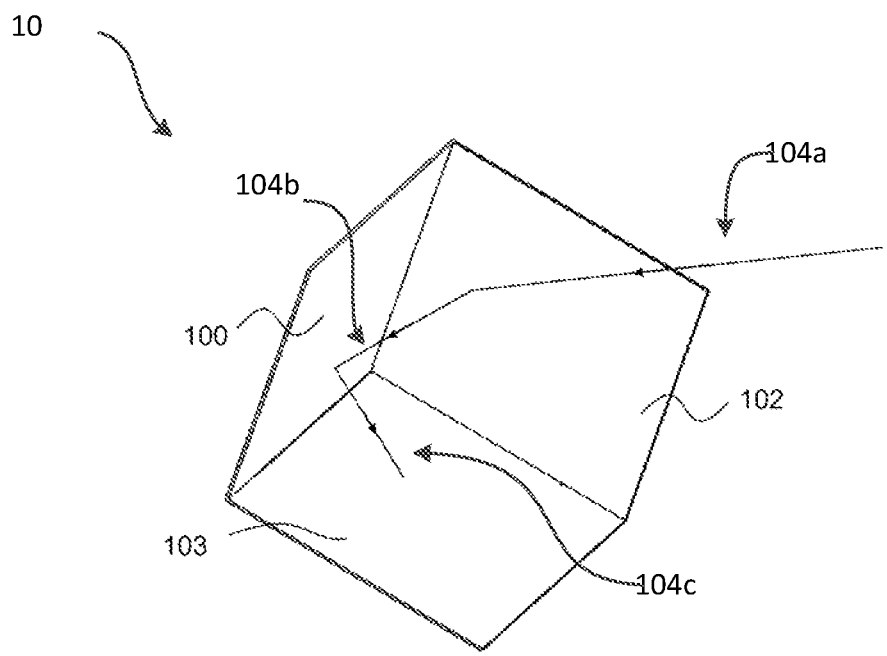
FIG. 1 illustrates an exemplary solar cell pit configuration according to some embodiments of the present disclosure.

FIG. 1 illustrates an exemplary solar cell pit configuration 10 according to some embodiments of the present disclosure. Solar cell pit 10 may include a first pit side 100, a second pit side 102, and a third pit side 103. The first pit side 100, the second pit side 102, and the third pit side 103 may have a ninety degree corner and each of the sides 100, 102, 103 may be joined such that the sides 100, 102, 103 are orthogonal to one another. FIG. 1 also illustrates an exemplary light ray 104a. Light ray 104a initially impinges on pit side 102. A portion of light ray 104a may be captured by pit side 102 and converted to energy and a remainder portion 104b may be reflected from the surface of pit side 102. Light ray 104b may be reflected toward pit side 100 where a portion of light ray 104b may be captured by pit side 100 and converted to energy and a remainder portion 104c may be reflected from the surface of pit side 100. Light ray 104c may be reflected toward the third pit side 103 where a portion of light ray 104c may be captured by pit side 103.

Figure 2:
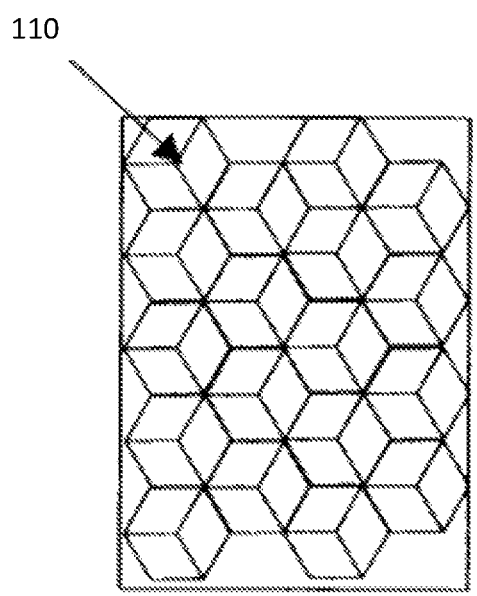
FIG. 2 illustrates an exemplary array of the solar cell pit configuration of FIG.

As mentioned above, in some embodiments, the solar cell pits may be arranged in an array to form a solar panel. Optionally, the solar cell pits may be tessellated to form the solar panel. For example, FIG. 2 illustrates an exemplary array 110 of the solar cell pit configuration 10 of FIG. 1 to form an exemplary solar panel according to some embodiments of the disclosure.

Figure 3:
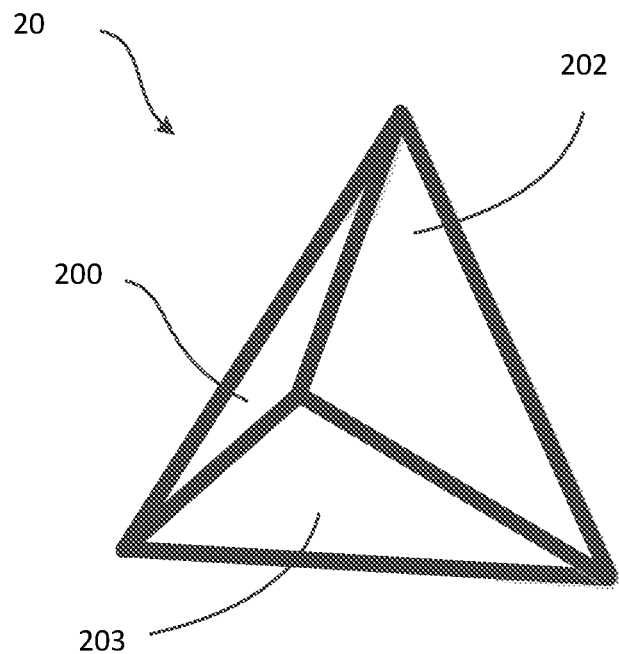
FIG. 3 illustrates another exemplary solar cell pit configuration according to some embodiments of the present disclosure.
Figure 4:
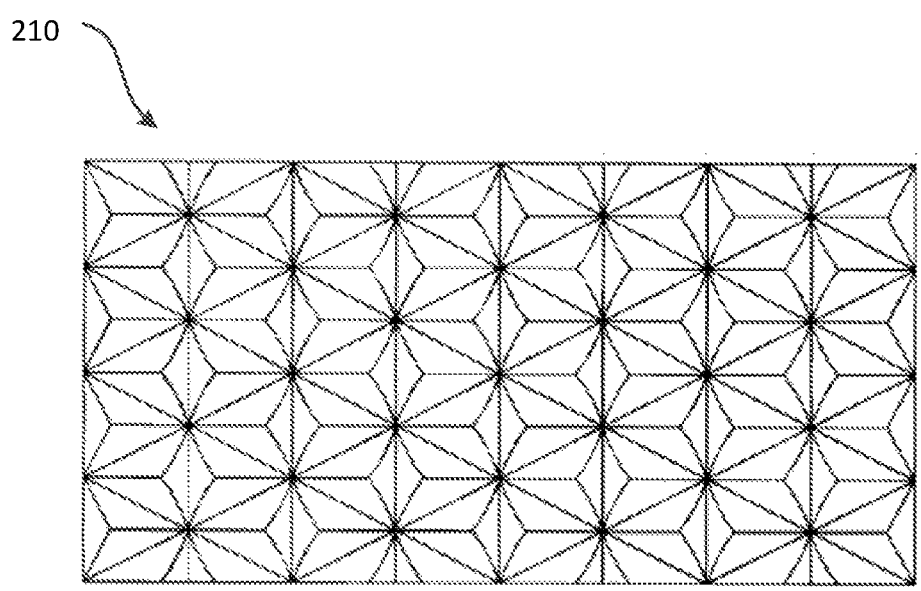
FIG. 4 illustrates an exemplary array of the solar cell pit configuration of FIG. 3.

While the pit sides 100, 102, 103 are illustrated as having a rectangular or square configuration, it should be understood that other configurations are possible. For example, FIG. 3 illustrates another exemplary solar cell pit configuration 20 according to some embodiments of the present disclosure. Solar cell pit 20 may include a first pit side 200, a second pit side 202, and a third pit side 203. The first pit side 200, the second pit side 202, and the third pit side 203 may have a triangular configuration. In some embodiments, the pit sides 200, 202, 203 may have an isosceles configuration with a ninety degree vertex angle. The sides 200, 202, 203 may be joined at the ninety degree corner and each of the sides 200, 202, 203 may be joined such that the sides 200, 202, 203 are orthogonal to one another. In such an embodiment, the solar cell pit 20 may define a triangular opening to the pit 20. Similar to pit 10 of FIG. 1, pit configuration 20 of FIG. 3 may be provided in an array to form a solar panel according to some embodiments. For example, FIG. 4 illustrates an exemplary array 210 of the solar cell pit configuration 20 of FIG. 3. As illustrated the solar panel 210 comprises a plurality of solar cell pits 20 that are tessellated.

While the exemplary embodiments illustrated in FIGS. 1-4 illustrate solar cell pits that are in a retroreflective configuration, it should be understood that other configurations are possible where the three panels are not orthogonal to one another. In some embodiments, the pit sides may be joined together at corners, where the corners of each of the pit sides is less than or greater than ninety degrees. For example, in some embodiments, the corners of the pit sides where the pit sides are joined may be between 80-120 degrees, preferably between 90-120 degrees. Additionally, while the exemplary embodiments illustrated in FIGS. 1-4 illustrate solar cell pits that comprise three sides, other embodiments may have three or more sides, e.g., four, five, six or more.

In some embodiments, the configurations described above could compound on itself, e.g., by arranging the photovoltaic cells in the same pit design on the sides of larger pits. This can continue ad infinitum. For example, three solar panels (e.g., panel 110, panel 210), each of which include a plurality of pits, may be arranged orthogonal to one another. The three solar panels may have a rectangular or triangular configuration.

The surface area of the proposed pitted design may increase the surface area over the typical flat design. For example, the embodiments illustrated in FIG. 4 may have approximately 73.2% more surface area compared to that of a traditional flat solar panel. This increase in cost and manufacturing may be offset by the increase in overall efficiency of the panel utilizing the pit configuration.

In some embodiments, the configurations and/or arrays may increase solar power efficiency, even without the use of motors. Advantageously, these static systems may reduce manufacturing, installation, and maintenance costs as these systems may be free from moving components. While this may be desirable in certain circumstances, the configurations and/or arrays described herein may also be used to improve the efficacy of solar panels that continuously move to keep facing the sun.

The invention claimed is:

1. A solar panel comprising:
   a pit comprising a first pit side of the pit, a second pit side of the pit, and a third pit side of the pit, wherein the first pit side, the second pit side, and the third pit side comprise a triangular configuration, and each of the first pit side, the second pit side, and the third pit side are configured to convert solar energy to electricity;
   wherein a first corner of the first pit side, a second corner of the second pit side, and a third corner of the third pit side are joined together such that a first edge is shared between the first pit side and the second pit side, a second edge is shared between the second pit side and the third pit side, and a third edge is shared between the third pit side and the first pit side, the first edge and the third edge converging to form the first corner of the first pit side, the first edge and the second edge converging to form the second corner of the second pit side, and the second edge and the third edge converging to form the third corner of the third pit side;
   wherein light received by the pit that impinges on the first pit side is partially captured by the first pit side to be converted to electricity and partially reflected by the first pit side toward the second pit side;
   wherein light reflected by the first pit side toward the second pit side is partially captured by the second pit side to be converted to electricity and partially reflected by the second pit side toward the third pit side; and
   wherein light reflected by the second pit side toward the third pit side is at least partially captured by the third pit side to be converted to electricity.

2. The solar panel of claim 1, comprising a plurality of the pits arranged in an array.

3. The solar panel of claim 2, wherein the plurality of pits are arranged in a tessellated array.

4. The solar panel of claim 1, wherein the first pit side, second pit side, and the third pit side are not orthogonal to one another.

5. The solar panel of claim 1, wherein the first edge and the third edge of the first pit side converge at a 80-120 degree angle to form the first corner of the first pit side, wherein the first edge and the second edge of the second pit side converge at a 80-120 degree angle to form the second corner of the second pit side, and wherein the second edge and the third edge of the third pit side converge at a 80-120 degree angle to form the third corner of the third pit side.

6. A solar panel system comprising a plurality of solar panels of claim 1, the plurality of solar panels each having a triangular configuration and joined together at an angle with one another.

7. The solar panel system of claim 6, wherein the plurality of solar panels comprises three solar panels, and wherein the three solar panels are joined such that each of the three solar panels are orthogonal to one another.

8. A solar panel comprising:
   a recessed pit comprising a first triangular pit side of the pit, a second triangular pit side of the pit, and a third triangular pit side of the pit, each of the first triangular pit side, the second triangular pit side, and the third triangular pit side configured to convert solar energy to electricity;
   the first solar cell, the second solar cell, and the third solar cell defining a four-sided opening of the recessed solar cell pit;
   wherein a first corner of the first triangular pit side, a second corner of the second triangular pit side, and a third corner of the third triangular pit side are joined together such that a first edge is shared between the first triangular pit side and the second triangular pit side, and a second edge is shared between the second triangular pit side and the third triangular pit side, the first edge and second edge converging to form the second corner of the second triangular pit side;
   wherein at least some light received by the pit through the four-sided opening of the pit that impinge on the first triangular pit side is partially captured by the first triangular pit side to be converted to electricity and partially reflected by the first triangular pit side toward the second triangular pit side;
   wherein at least some light reflected by the first triangular pit side toward the second triangular pit side is partially captured by the second triangular pit side to be converted to electricity and partially reflected by the second triangular pit side toward the third triangular pit side; and
   wherein light reflected by the second triangular pit side toward the third triangular pit side is at least partially captured by the third triangular pit side to be converted to electricity.

9. The solar panel of claim 8, comprising a plurality of the pits arranged in an array.

10. A solar panel system comprising a plurality of solar panels of claim 8, the plurality of solar panels joined such that each of the solar panels are at 90-110 degrees relative to one another.

11. The solar panel system of claim 10, wherein the plurality of solar panels comprises three solar panels, and wherein the three solar panels are not orthogonal to one another.

12. A solar panel comprising:

a tessellated array of pits, each of the pits of the tessellated array comprising:

a first pit side of the pit, a second pit side of the pit, and a third pit side of the pit, each of the first pit side, the second pit side, and the third pit side configured to convert solar energy to electricity and each comprising a first edge and a second edge that converge at a ninety degree angle to form a corner, wherein the corners of the pit sides of the pit are joined together such that the corners of the pit sides form a bottom of the pit and such that the pit sides are at an angle between 60-110 degrees with adjacent pit sides, and the first pit side, the second pit side, and the third pit side defining a three or more sided opening of the pit;

wherein at least some light received by the pit through the three or more sided opening of the pit that impinges on the first pit side is partially captured by the first pit side to be converted to electricity and partially reflected by the first pit side toward the second pit side;

wherein at least some light reflected by the first pit side toward the second pit side is partially captured by the second pit side to be converted to electricity and partially reflected by the second pit side toward the third pit side; and wherein light reflected by the second pit side toward the third pit side is at least partially captured by the third pit side to be converted to electricity.

13. The solar panel system of claim 12, wherein the pit sides are at an angle between 90-110 degrees with adjacent pit sides.

14. The solar panel system of claim 13, wherein the pit sides are orthogonal with adjacent pit sides.

15. The solar panel system of claim 12, wherein the pit sides are not orthogonal with adjacent pit sides.

16. The solar panel system of claim 12, wherein the first pit side, the second pit side, and the third pit side define a five-sided opening of the pit.

17. A solar panel system comprising a plurality of the solar panels of claim 12, the plurality of the solar panels joined together at a 60-110 degree angle.

18. The solar panel system of claim 17, wherein the plurality of solar panels comprises three solar panels and wherein the three solar panels are at 90-110 degrees with adjacent solar panels.

19. The solar panel system of claim 18, wherein the three solar panels are orthogonal to one another.

20. The solar panel system of claim 17, wherein each of the solar panels of the plurality of solar panels has a triangular configuration.

* * * * *